United States Patent
Lin et al.

(10) Patent No.: US 9,123,564 B2
(45) Date of Patent: Sep. 1, 2015

(54) SEMICONDUCTOR DEVICE WITH CONFORMAL DOPING AND METHOD OF MAKING

(71) Applicant: TAIWAN SEMICONDUCTOR MANUFACTURING COMPANY LIMITED, Hsin-Chu (TW)

(72) Inventors: Yu-Chang Lin, Hsinchu (TW); Wen-Tai Lu, Hsinchu (TW); Li-Ting Wang, Hsinchu (TW); Chun-Feng Nieh, Hsinchu (TW); Hou-Yu Chen, Zhubei (TW); Huicheng Chang, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/097,399

(22) Filed: Dec. 5, 2013

(65) Prior Publication Data

US 2015/0162330 A1    Jun. 11, 2015

(51) Int. Cl.
| | |
|---|---|
| H01L 27/088 | (2006.01) |
| H01L 29/78 | (2006.01) |
| H01L 29/66 | (2006.01) |
| H01L 21/223 | (2006.01) |
| H01L 21/324 | (2006.01) |
| H01L 21/8234 | (2006.01) |

(52) U.S. Cl.
CPC ........ *H01L 27/0886* (2013.01); *H01L 21/2236* (2013.01); *H01L 21/324* (2013.01); *H01L 21/823412* (2013.01); *H01L 29/66484* (2013.01); *H01L 29/66795* (2013.01); *H01L 29/7831* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 8,202,799 | B2 | 6/2012 | Lin |
| 8,501,569 | B2 | 8/2013 | Huang |
| 2006/0273384 | A1* | 12/2006 | Hshieh .......................... 257/330 |
| 2010/0184242 | A1 | 7/2010 | Lin |
| 2013/0102137 | A1 | 4/2013 | Jeng |
| 2013/0105923 | A1 | 5/2013 | Yu |
| 2013/0171790 | A1 | 7/2013 | Wang |
| 2013/0249021 | A1 | 9/2013 | Asenov et al. |
| 2013/0264652 | A1 | 10/2013 | Zhu et al. |

FOREIGN PATENT DOCUMENTS

EP      0573033   A1    12/1993

* cited by examiner

*Primary Examiner* — Kyoung Lee
(74) *Attorney, Agent, or Firm* — Cooper Legal Group, LLC

(57) ABSTRACT

A semiconductor arrangement is provided. The semiconductor arrangement includes a first semiconductor device. The first semiconductor device includes a first active region having a first doped region and a second doped region over the first doped region. The second doped region includes a first bottom portion and a first sidewall. The first bottom portion includes a first bottom portion inner surface, a first bottom portion outer surface, a first bottom portion height and a first bottom portion width. The first sidewall includes a first sidewall inner surface, a first sidewall outer surface, a first sidewall width and a first sidewall height, the first sidewall height greater than the first bottom portion height. A method of making a semiconductor device is also provided.

20 Claims, 12 Drawing Sheets

SEMICONDUCTOR DEVICE WITH CONFORMAL DOPING AND METHOD OF MAKING

BACKGROUND

A transistor, such as MUGFET transistor (multiple gate field effect transistor), comprises a source region, a drain region, a gate and a channel region between the source region and the drain region. MUGFETS often include more than one gate into a single device. In some MUGFETs multiple gates are controlled by a single gate electrode, wherein multiple gate surfaces act electrically as a single gate, or by independent gate electrodes. The gate controls the channel region to operate the transistor. The gate is formed around one or more surfaces of the channel region, which provides the gate with increased control over the channel region.

DETAILED DESCRIPTION

Figure 1:
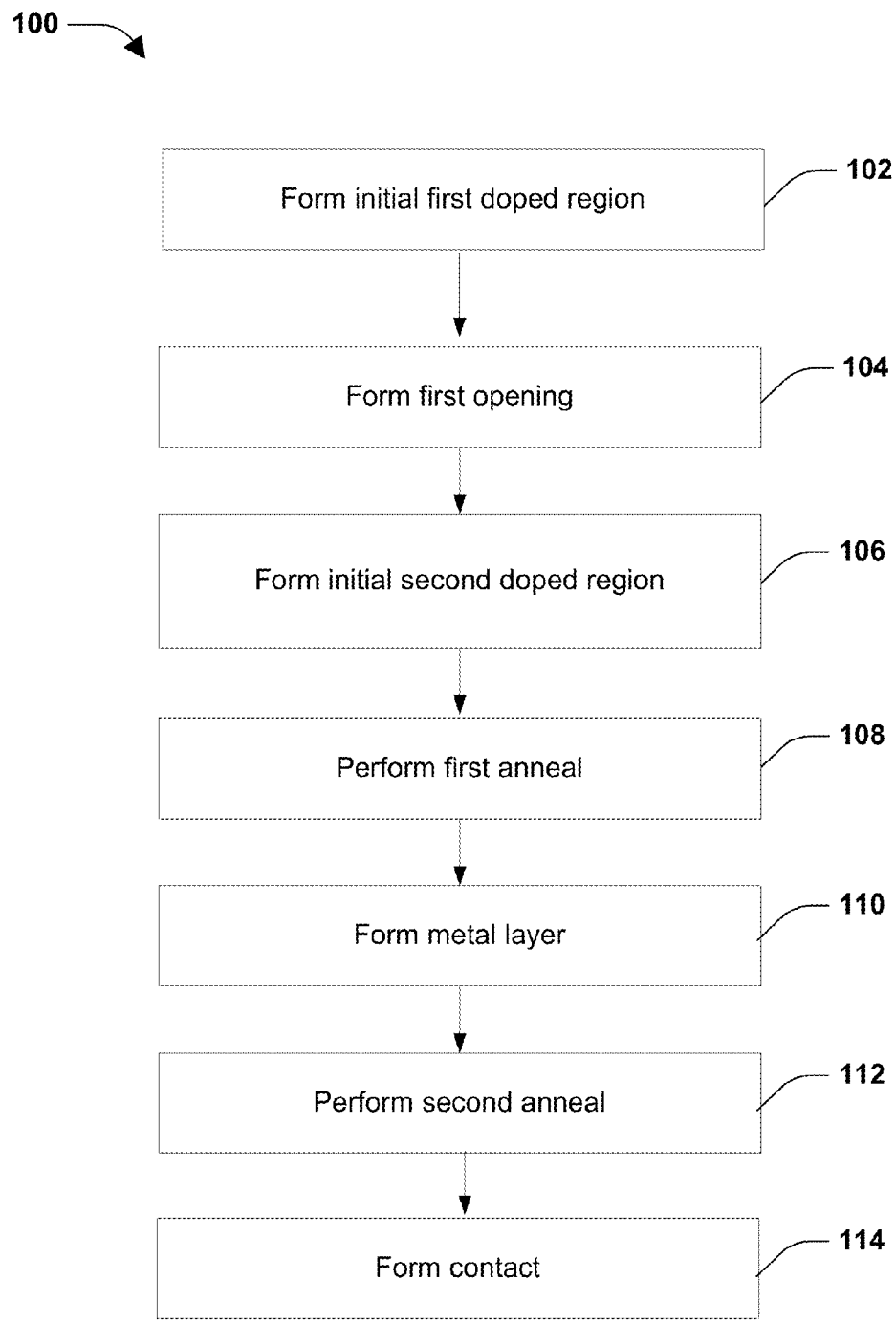
FIG. 1 is a flow diagram illustrating a method for fabricating a semiconductor device, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more semiconductor arrangements containing one or more semiconductor devices and one or more methods for forming such semiconductor devices are provided herein. In some embodiments, a semiconductor device includes a MUGFET device, such as a multi-gate transistors or fin-type multi-gate transistor. In some embodiments, a semiconductor arrangement includes at least one of a first semiconductor device that includes a PMOS or a second semiconductor that includes a NMOS.

Referring to FIG. 1, illustrated is a flow diagram of a method 100 for fabricating a semiconductor device 200 according to some embodiments. Referring also to FIGS. 2 to 9, illustrated are cross-sectional views of a first semiconductor device 200 at various stages of fabrication according to some embodiments, such as according to the method 100 of FIG. 1. In some embodiments, part of the first semiconductor device 200 is fabricated with a CMOS process flow. In some embodiments, additional processes are provided before, during, and after the method 100 of FIG. 1.

Figure 2:
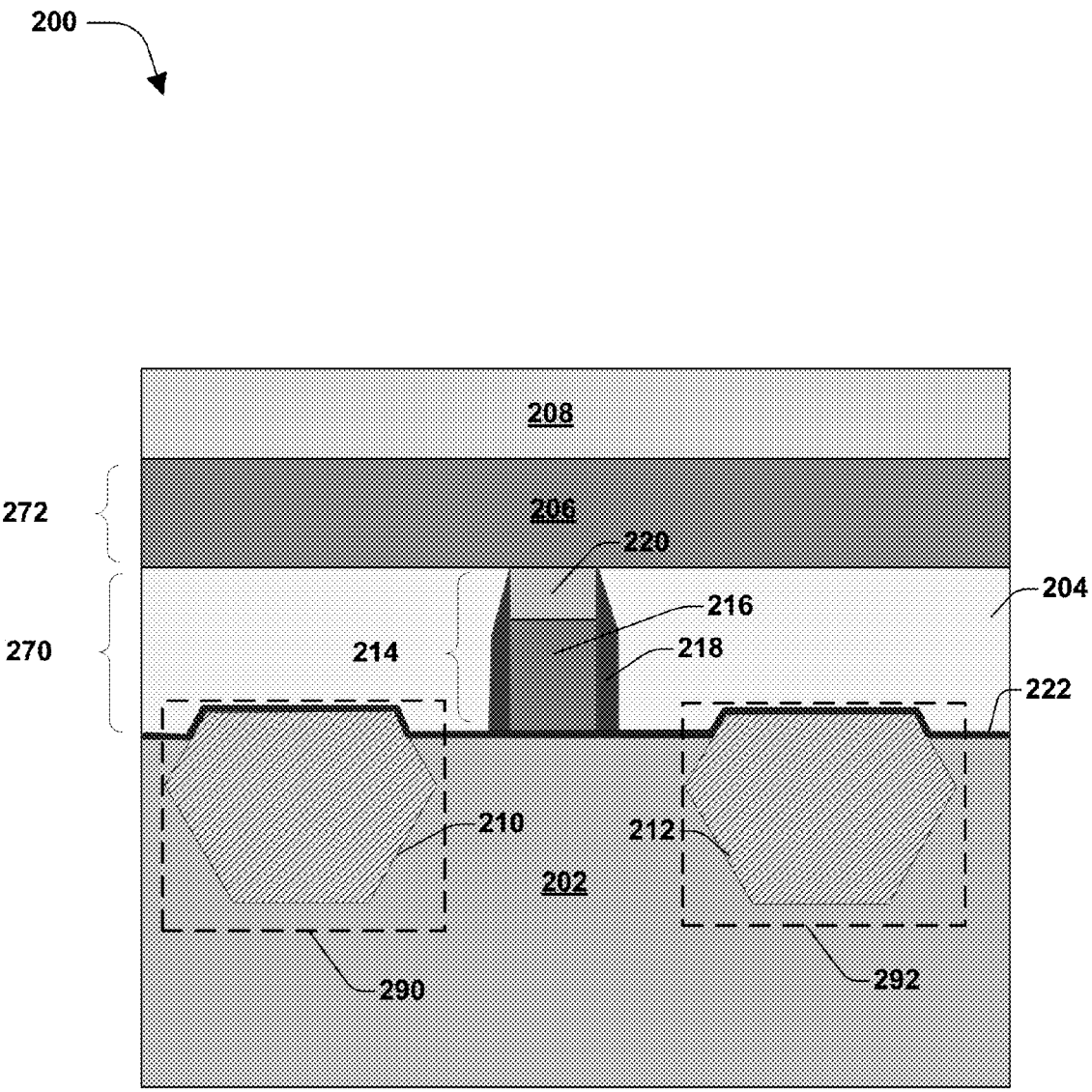
FIG. 2 is a cross-sectional view of a semiconductor device during fabrication, according to some embodiments.

At 102, an initial first doped region 210 is formed, as illustrated in FIG. 2. In some embodiments, the initial first doped region 210 is formed in a substrate 202. In some embodiments, the initial first doped region 210 is formed in a first active region 290 in the substrate 202. In some embodiments, the initial first doped region 210 includes at least one of an n-type or a p-type dopant. In some embodiments, the n-type dopant includes at least one of arsenic or phosphorous. In some embodiments, the p-type dopant includes boron. In some embodiments, the initial first doped region 210 is epitaxially grown. In some embodiments, the initial first doped region 210 is grown by at least one of solid-phase epitaxy (SPE) or vapor-phase epitaxy. In some embodiments, an impurity is added to the initial first doped region 210 during the growth process via in-situ doping. In some embodiments, the impurity includes at least one of arsenic, phosphorous, antimony, boron or boron di-fluoride. In some embodiments, an initial third doped region 212 is disposed in a second active region 292. In some embodiments, an opening 226 extends down to second active region 292. In some embodiments, the initial third doped region 212 is similar to the initial first doped region 210. In some embodiments, the initial first doped region 210 and the initial third doped region 212 have a first conductivity type.

In some embodiments, the substrate 202 is a silicon substrate. In some embodiments, the substrate 202 includes at least one of silicon germanium, silicon carbide, gallium arsenic, gallium phosphide, indium phosphide, indium arsenide, indium antimonide or other suitable semiconductor material. In some embodiments, the substrate 202 is a semiconductor on an insulator such as silicon on insulator (SOI).

In some embodiments, a gate structure 214 is formed over the substrate 202. In some embodiments, the gate structure 214 includes at least one of a gate dielectric layer 216, a sidewall spacer 218 or a gate electrode layer 220. In some embodiments, the gate dielectric layer 216 includes at least one of silicon oxide, silicon nitride, silicon oxynitride, or a high-k dielectric material. In some embodiments, the gate dielectric layer 216 has a thickness of about 10 to 30 angstroms. In some embodiments, the gate dielectric layer 216 is formed using at least one of a atomic layer deposition (ALD), chemical vapor deposition (CVD), physical vapor deposition (PVD) or thermal oxidation process. In some embodiments, the sidewall spacer 218 includes at least one of silicon nitride, silicon oxide, silicon carbide or silicon oxynitride. In some embodiments, the sidewall spacer 218 is about 12 to about 16 nm wide.

In some embodiments, the gate electrode layer 220 includes at least one of a single layer or a multilayer structure. In some embodiments, the gate electrode layer 220 includes a poly-silicon. In some embodiments, the gate electrode layer 220 includes a doped poly-silicon with at least one of a uniform or a non-uniform doping. In some embodiments, the gate electrode layer 220 includes a metal. In some embodiments, the gate electrode layer 220 includes at least one of A, Cu, W, Ti, Ta, TiN, TiAl, TiAlN, TaN, NiSi or CoSi. In some embodiments, the gate electrode layer 220 includes a conductive material with a work function. In some embodiments, the gate electrode layer 220 has a thickness of about 10 nm to about 60 nm. In some embodiments, the gate electrode layer 220 is formed using at least one of an ALD, CVD, PVD or a plating process. In some embodiments, the first active region 290 is located on a first side of the gate structure 214 and the second active region 292 is located on a second side of the gate structure 214.

In some embodiments, an interfacial layer 222 is formed over at least one of the initial first doped region 210 or the substrate 202. In some embodiments, the interfacial layer 222 includes at least one of silicon oxide or silicon oxynitride. In some embodiments, the interfacial layer 222 is formed by at least one of an ALD, CVD, PVD or thermal oxidation process. In some embodiments, the interfacial layer 222 inhibits damage between the gate structure 214 and the substrate 202.

In some embodiments, an interlayer dielectric (ILD) layer 204 is formed over at least one of the substrate 202 or the gate structure 214. In an embodiment, the ILD layer 204 includes a low k material. In an embodiment, the ILD layer 204 includes an oxide. In some embodiments, the ILD layer is formed by at least one of a high aspect ratio process (HARP), spin-on process, sputtering process, CVD process or high density plasma (HDP) deposition process. In an embodiment, the deposition of the ILD layer 204 fills in a gap between the first semiconductor device 200 and an adjacent semiconductor device. In some embodiments, the ILD layer 204 has a thickness 270. In some embodiments, thickness 270 is about 30 to about 110 nm.

In some embodiments, an oxide layer 206 is formed over at least one of the ILD layer 204 or the substrate 202. In some embodiments, the formation of the oxide layer 206 includes at least one of deposition, CVD, or other suitable process. In some embodiments, the oxide layer 206 includes at least one of an oxide, silicon oxide, nitrides, silicon nitride, oxynitrides, or $SiO_2$. In some embodiments, the oxide layer 206 has a thickness 272. In some embodiments, thickness 272 is about 30 to about 100 nm.

In some embodiments, a first photoresist layer 208 is formed over at least one of the oxide layer 206 or the substrate 202. In some embodiments, the first photoresist layer 208 is formed by at least one of photolithography, immersion lithography, ion-beam writing, or other suitable processes. In some embodiments, the photolithography process includes at least one of spin coating, soft-baking, exposure, post-baking, developing, rinsing, drying, or other suitable process.

Figure 3:
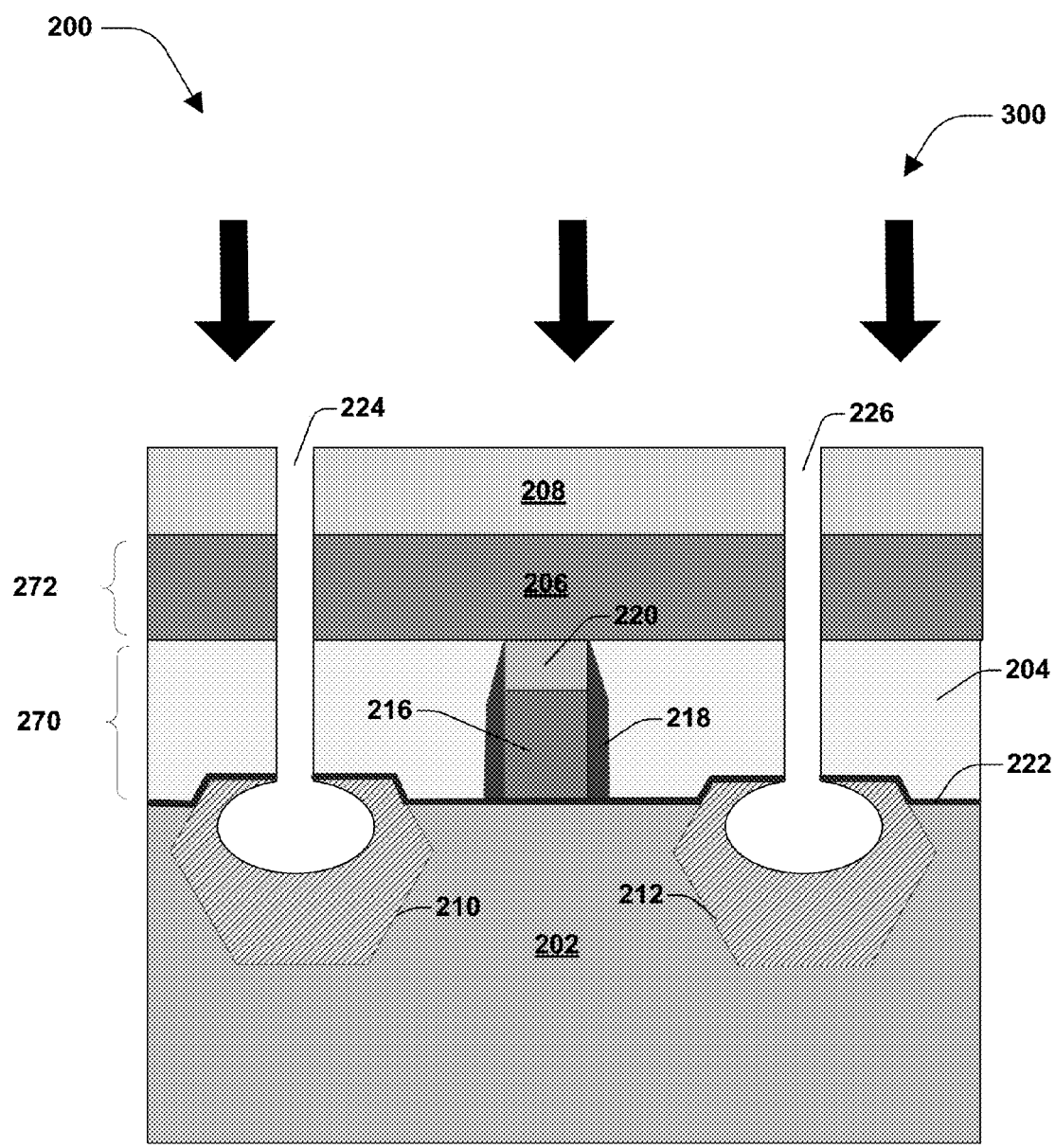
FIG. 3 is a cross-sectional view of a semiconductor device during fabrication, according to some embodiments.

At 104, a first opening 224 is formed in the initial first doped region 210, as illustrated in FIG. 3. In some embodiments, the first opening 224 extends through at least one of the ILD layer 204, the oxide layer 206 or the photoresist layer 208. In some embodiments, the first opening 224 is formed by a first process 300. In some embodiments, the first process 300 includes at least one of a photolithography process or an etch process. In some embodiments, the photolithography process includes exposing the first photoresist layer 208 to a pattern, performing post-exposure bake processes, and developing the first photoresist layer 208 to form a masking element from the photoresist layer. In some embodiments, the etch process is preformed over the masking element and an exposed surface. In some embodiments, the etch process forms the first opening 224 in the initial first doped region. In some embodiments, the process 300 forms a second opening 226 in the third initial doped region 212. In some embodiments, the first process 300 includes at least one of a reactive ion etch (RIE), a hydrofluoric acid (HF) etch or a dry etch. In some embodiments, the dry etch includes the use of at least one of $CF_4$, $SF_6$, or $NF_3$. In some embodiments, the first opening 224 has a first shape. In some embodiments, the first shape is oval.

Figure 4A:
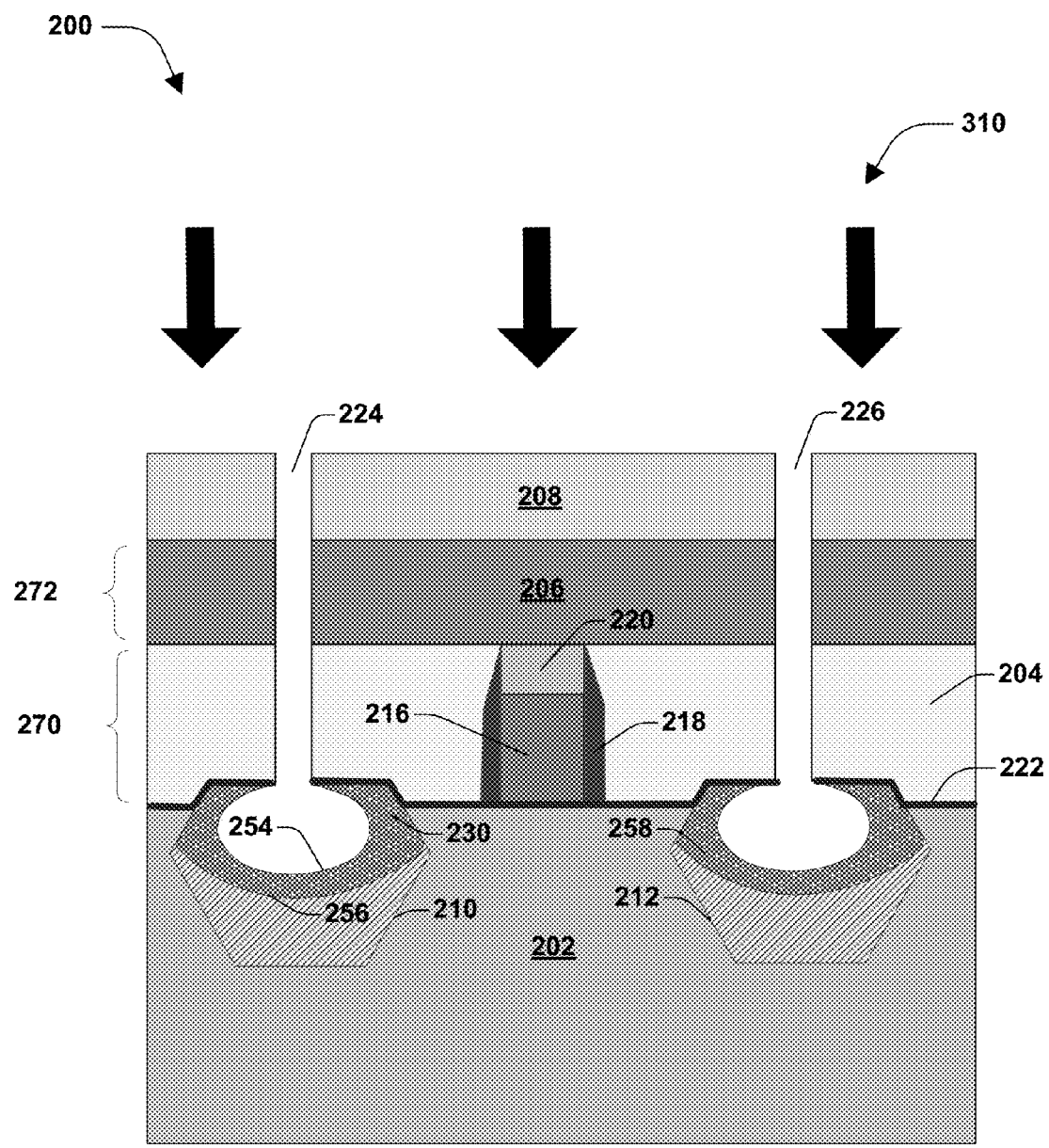
FIG. 4a is a cross-sectional view of a semiconductor device during fabrication, according to some embodiments.

At 106, an initial second doped region 230 is formed, as illustrated in FIG. 4a. In some embodiments, the second initial doped region is formed by a process 310. In some embodiments, the process 310 is a conformal doping process. In some embodiments, process 310 includes at least one of a plasma doping or a monolayer doping. In some embodiments, the process 310 uses a dopant. In some embodiments, the dopant includes at least one of boron, arsenic or phosphorous. In some embodiments, the dopant includes at least one of $B_2H_6$, $BF_3$, $AsH_3$ or $PH_3$. In some embodiments, the dopant is applied at a concentration of about $1E^{15}$ to about $1E^{17}$ $cm^{-2}$.

Figure 4B:
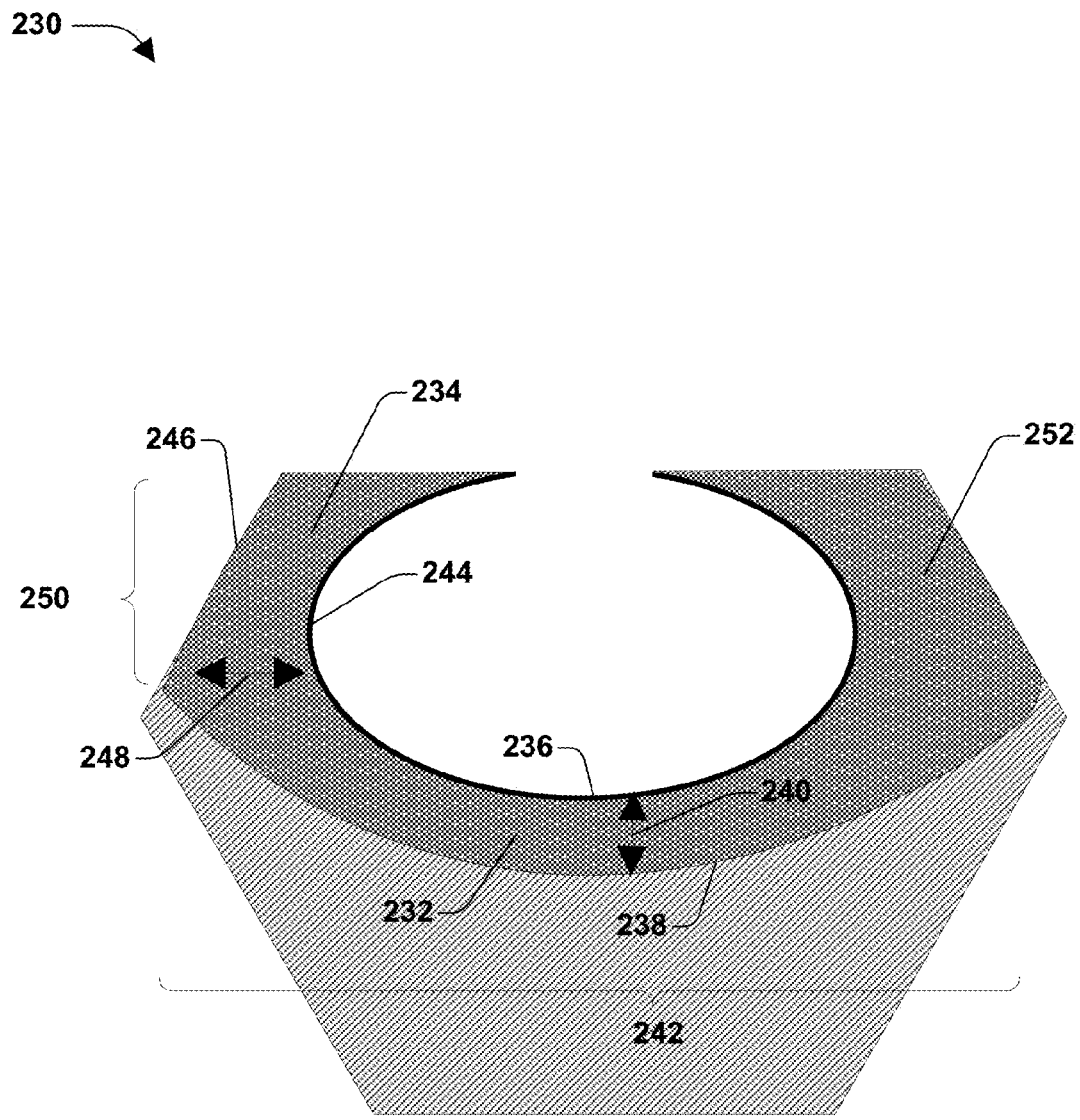
FIG. 4b is a cross-sectional view of a semiconductor device during fabrication, according to some embodiments.

In some embodiments, the initial second doped region 230 is over the initial first doped region 210. In some embodiments, the initial second doped region 230 is formed by doping the initial first doped region 210. In some embodiments, a portion of the initial first doped region 210 is consumed by the formation of the initial second doped region 230. In some embodiments, the initial second doped region 230 includes at least one of a first bottom portion 232 or a first sidewall 234, as illustrated in FIG. 4b. In some embodiments, the first bottom portion 232 includes at least one of a first bottom portion inner surface 236, a first bottom portion outer surface 238, a first bottom portion height 240 and a first bottom portion width 242. In some embodiments, the first sidewall 234 is adjacent the first bottom portion 232. In some embodiments, the first sidewall 234 includes at least one of a first sidewall inner surface 244, a first sidewall outer surface 246, a first sidewall width 248 or a first sidewall height 250. In some embodiments, at least one of the first bottom portion height 240 or the first sidewall width 248 is about 10 to about 20 nm. In some embodiments, the first sidewall height 250 is greater than the first bottom portion height 240. In some embodiments, the initial second doped region 230 includes a second sidewall 252. In some embodiments, the initial second doped region 230 includes a first inner surface 254 defined by the first shape of the first opening 224. In some embodiments, the first inner surface 254 includes at least one of the first bottom portion inner surface 236 or the first sidewall inner surface 244.

In some embodiments, at least one of the first bottom portion 232 or the first sidewall 234 includes a dopant gradient. In some embodiments, the dopant gradient includes at least one of a first dopant concentration or a second dopant concentration. In some embodiments, the first dopant concentration is near the first inner surface 254 and the second dopant concentration is near a first outer surface 256, as illustrated in FIG. 4a. In some embodiments, the first inner surface 254 includes at least one of the first sidewall inner surface 244 or first bottom portion inner surface 236. In some embodiments, the first outer surface 256 includes at least one of the first bottom portion outer surface 238 or the first sidewall outer surface 246. In some embodiments, the second dopant concentration is lower than the first dopant concentration. In some embodiments, the first dopant concentration is about $7e^{21}$ $cm^{-3}$ to about $9e^{21}$ $cm^{-3}$. In some embodiments, the second dopant concentration is about $1e^{21}$ $cm^{-3}$ to about $6e^{21}$ $cm^{-3}$.

In some embodiments, an initial fourth doped region 258 is formed over the initial third doped region 212. In some embodiments, the initial third doped region 258 is similar to the initial second doped region. In some embodiments, the initial fourth doped region 258 includes at least one of a second bottom portion or a third sidewall. In some embodiments, the second bottom portion includes at least one of a second bottom portion inner surface, a second bottom portion outer surface, a second bottom portion height or a second bottom portion width. In some embodiments, the third sidewall is adjacent the second bottom portion. In some embodiments, the third sidewall includes at least one of a third sidewall inner surface, a third sidewall outer surface, a third sidewall width or a third sidewall height. In some embodiments, the third sidewall height is greater than the second bottom portion height. In some embodiments, at least one of the initial second doped region 230 or the initial fourth doped region 258 is concave.

Figure 5:
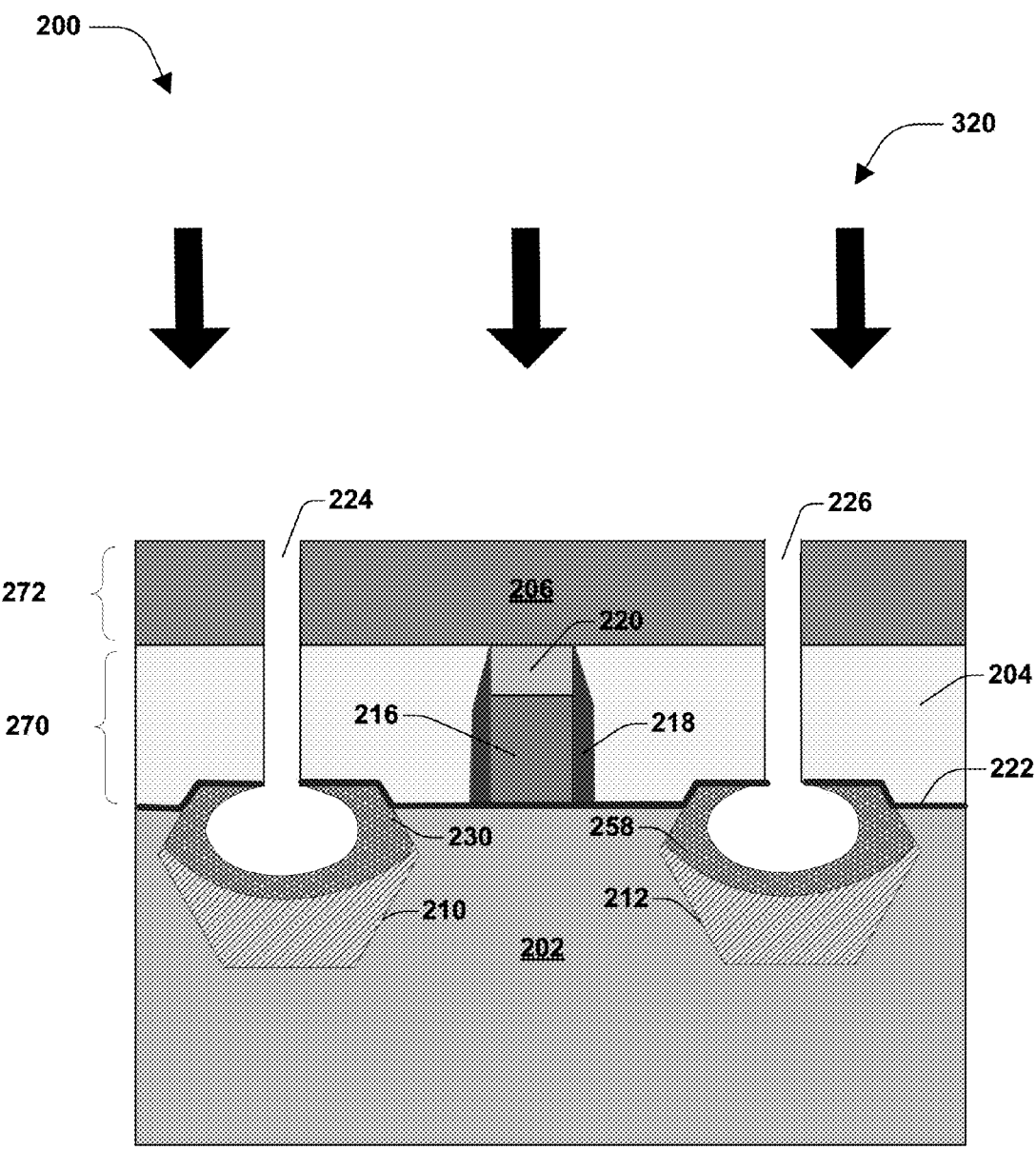
FIG. 5 is a cross-sectional view of a semiconductor device during fabrication, according to some embodiments.

In some embodiments, the first photoresist layer 208 is removed after the formation of at least one of the initial second doped region 230 of the initial fourth doped region 258, as illustrated in FIG. 5. In some embodiments, the first photoresist layer 208 is removed by a process 320. In some embodiments, process 320 includes at least one of a stripping or ashing process. In some embodiments, a second photoresist layer (not shown) is formed over at least one of the initial second doped region 230, the initial fourth doped region 258, the first opening 224 of the second opening 226. In some embodiments, the second photoresist layer protects the first semiconductor device 200 from the doping of another semiconductor device.

Figure 6:
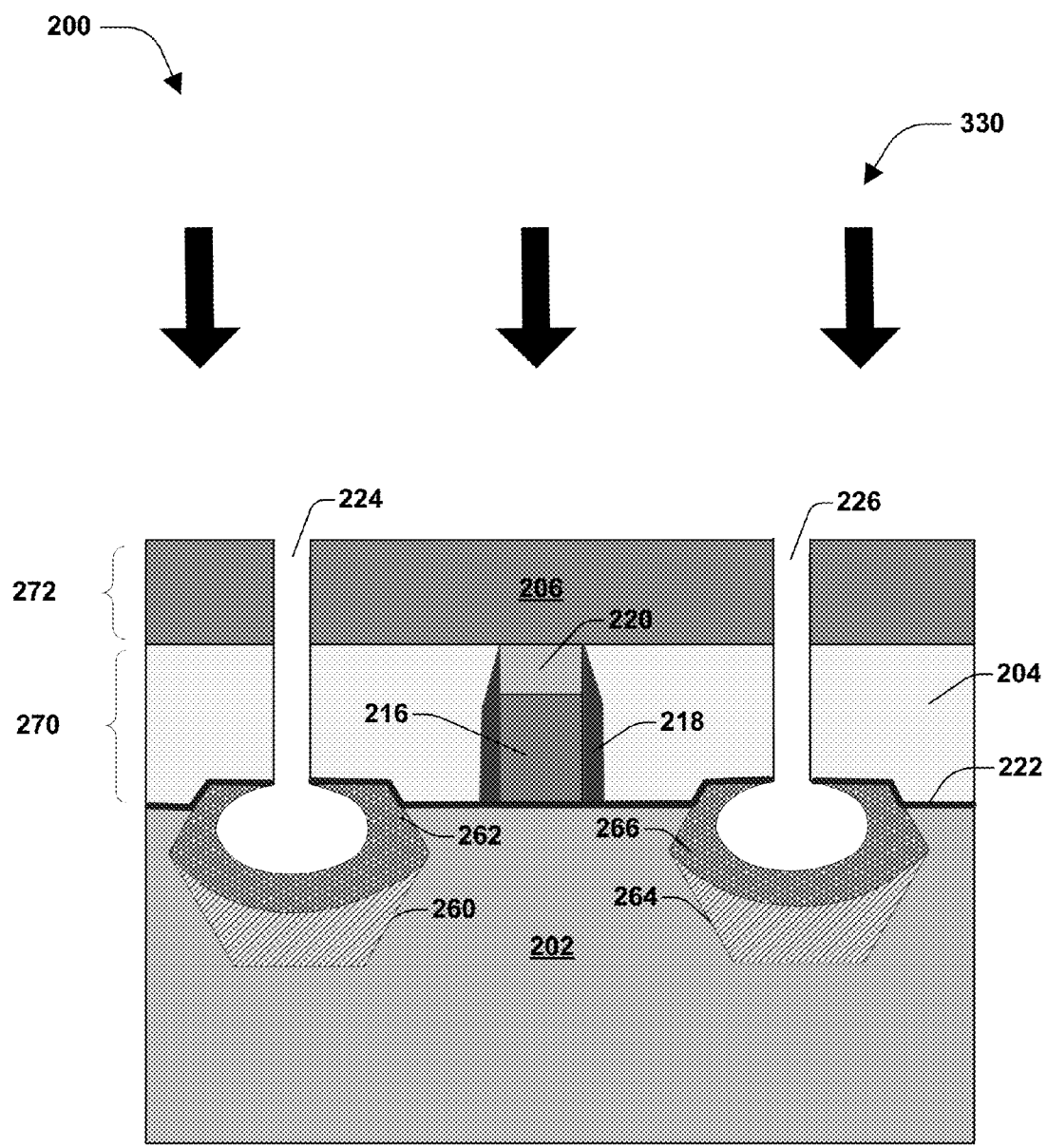
FIG. 6 is a cross-sectional view of a semiconductor device during fabrication, according to some embodiments.

At 108, a first anneal 330 is performed, as illustrated by FIG. 6. In some embodiments, the first anneal 330 drives the initial second doped region 230 into the initial first doped region 210. In some embodiments, the first anneal 330 forms at least one of a first doped region 260 or a second doped region 262. In some embodiments, the first anneal 330 increases at least one of the first bottom portion height 240 or the first sidewall width 248. In some embodiments, the initial first doped region 210 and the initial second doped region 230 are the same as the first doped region 260 and the second doped region 262, respectively. In some embodiments, the first anneal 330 forms a third doped region 264 and a fourth doped region 266 from the initial third doped region 212 and the initial fourth doped region 258, respectively. In some embodiments, the first anneal 330 decreases a distance between the second doped region 262 and the fourth doped region 266. In some embodiments, at least one of the second doped region 260 or the fourth doped region 266 is concave. In some embodiments, the first anneal 330 is at least one of a rapid thermal anneal (RTA), a dynamic spike anneal (DSA), a laser spike anneal (LSA) or an ultra sub-second anneal (uSSA). In some embodiments, the first anneal 330 is at least one of a RTA performed at about 550 to about 1300° C. for about 1 to about 3 seconds, a DSA performed at about 800 to about 1412° C. for less than about 1 millisecond, a LSA performed at about 1000 to about 1412° C. for less than about 1 millisecond or a uSSA performed at about 900 to about 1350° C. for about 0.2 to about 40 milliseconds. In some embodiments, the first anneal 330 is not preformed.

Figure 7:
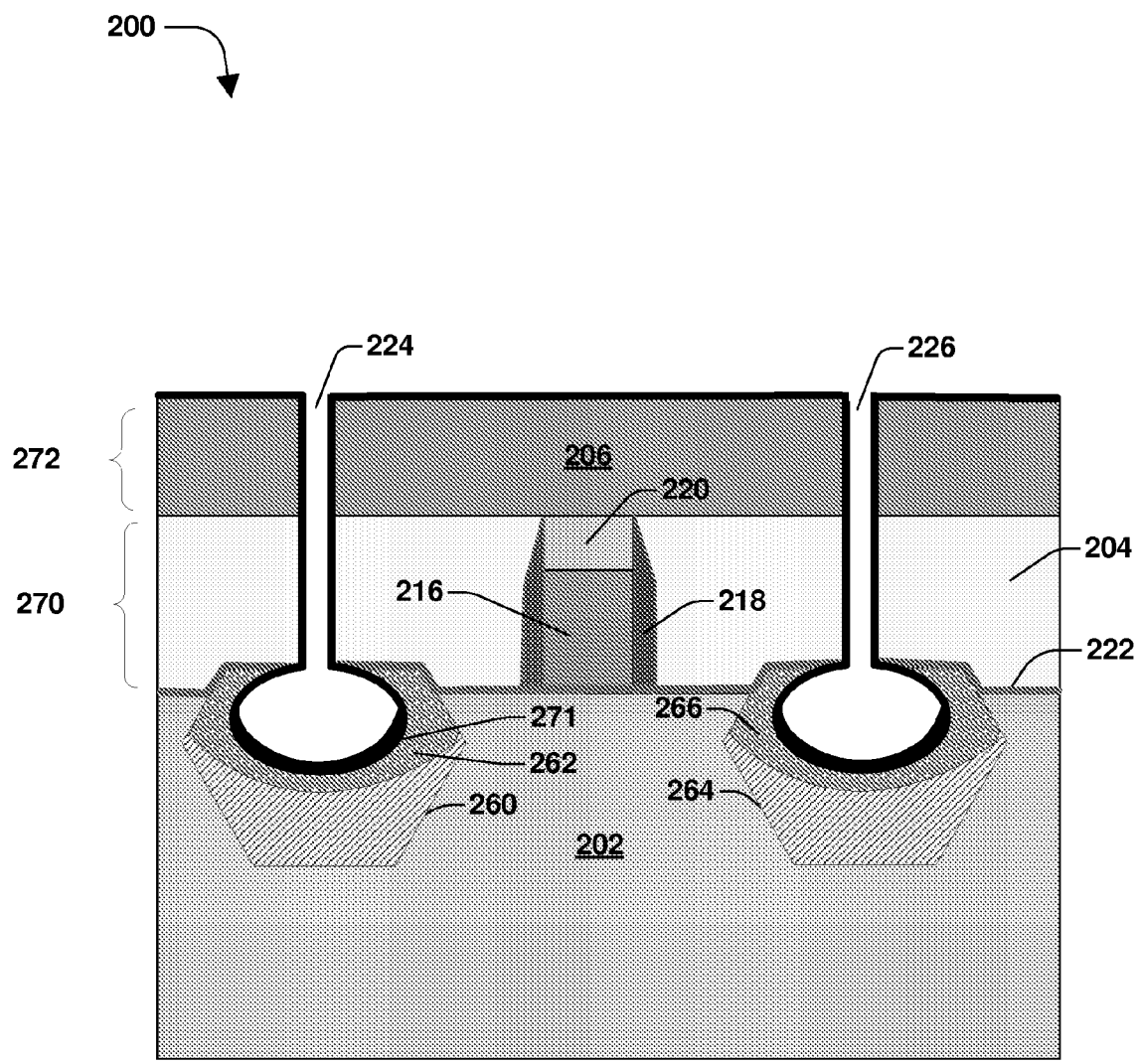
FIG. 7 is a cross-sectional view of a semiconductor device during fabrication, according to some embodiments.

At 110, a metal layer 271 is formed, as illustrated in FIG. 7. In some embodiments, the metal layer 271 is formed over at least one of the initial second doped region 230, the initial fourth doped region 258, the second doped region 262 of the fourth doped region 266. In some embodiments, the metal layer 271 extends over oxide layer 206 and down into at least one of the first opening 224 or the second opening 226. In some embodiments, the metal layer 271 includes a silicide metal. In some embodiments, the metal layer 271 includes at least one of cobalt, nickel, tungsten, vanadium, bismuth, titanium, tantalum, aluminum, platinum, cobalt silicide, nickel silicide, platinum silicide, palladium silicide or tungsten silicide. In some embodiments, the metal layer 271 is formed by at least one of CVD, PECVD, PVD, ALD or electroplating.

Figure 8:
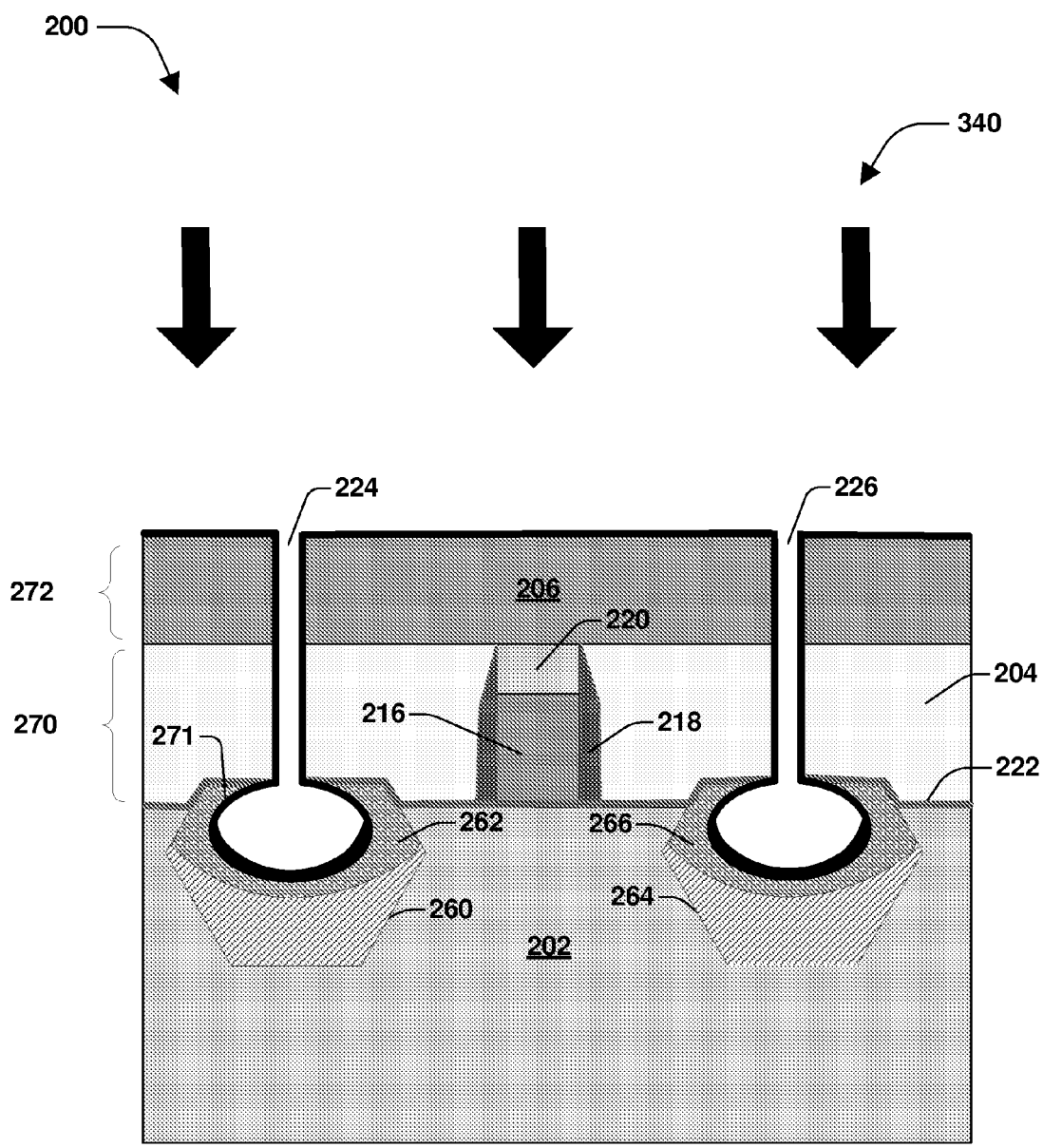
FIG. 8 is a cross-sectional view of a semiconductor device during fabrication, according to some embodiments.

At 112, a second anneal 340 is performed, as illustrated in FIG. 8. In some embodiments, when the first anneal 330 is not performed and the second anneal 340 drives the initial second doped region 230 into the initial first doped region 210. In some embodiments, the second anneal 340 forms at least one of the first doped region 260, the second doped region 262, the third doped region 264 or the fourth doped region 266. In some embodiments, the second anneal 340 increases at least one of the first bottom portion height 240 or the first sidewall width 248. In some embodiments, the initial first doped region 210 and the initial second doped region 230 are the same as the first doped region 260 and the second doped region 262, respectively. In some embodiments, the second anneal 340 drives the metal layer 271 into at least one of the initial second doped region 230, the initial fourth doped region 258, the second doped region 262 or the fourth doped region 266. In some embodiments, the second anneal 340 is at least one of a RTA, a DSA, a LSA or an uSSA. In some embodiments, the second anneal 340 is at least one of a RTA performed at about 550 to about 800° C. for about 1 to about 3 seconds, a DSA performed at about 800 to about 1200° C. for less than about 1 millisecond, a LSA performed at about 1000 to about 1200° C. for less than about 1 millisecond or a uSSA performed at about 900 to about 1200° C. for about 0.2 to about 40 milliseconds.

Figure 9:
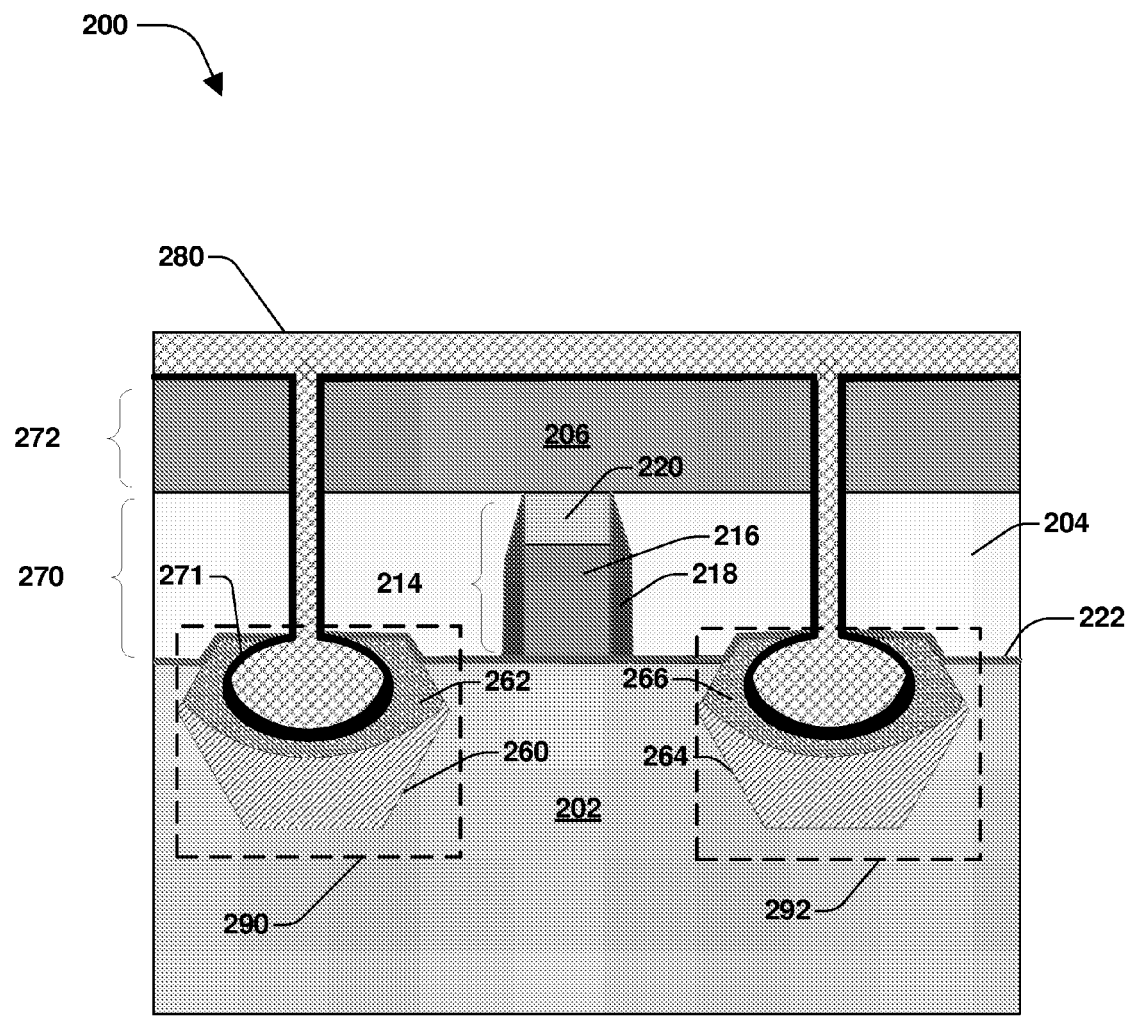
FIG. 9 is a cross-sectional view of a semiconductor device during fabrication, according to some embodiments.

At 114, a contact 280 is formed, as illustrated in FIG. 9. In some embodiments, the contact 280 extends through at least one of the oxide layer 206 or the ILD layer 204. In some embodiments, the contact 280 contacts at least one of the first active region 290 or the second active region 292. In some embodiments, the contact 280 contacts the metal layer 271. In some embodiments, the contact 280 is at least one of a source contact or a drain contact. In some embodiments, the contact 280 extends over the oxide layer 206 and fills in at least one of the first opening 224 or the second opening 226. In some embodiments, the contact 280 includes a metal. In some embodiments, the contact 280 includes tungsten. In some embodiments, the contact 280 provides electrical access to at least one of the first active region 290 or the second active region 292. In some embodiments, at least one of the second doped region or the fourth doped region inhibits a resistance at the contact 280 by enlarging an area of contact at the contact 280.

Figure 10:
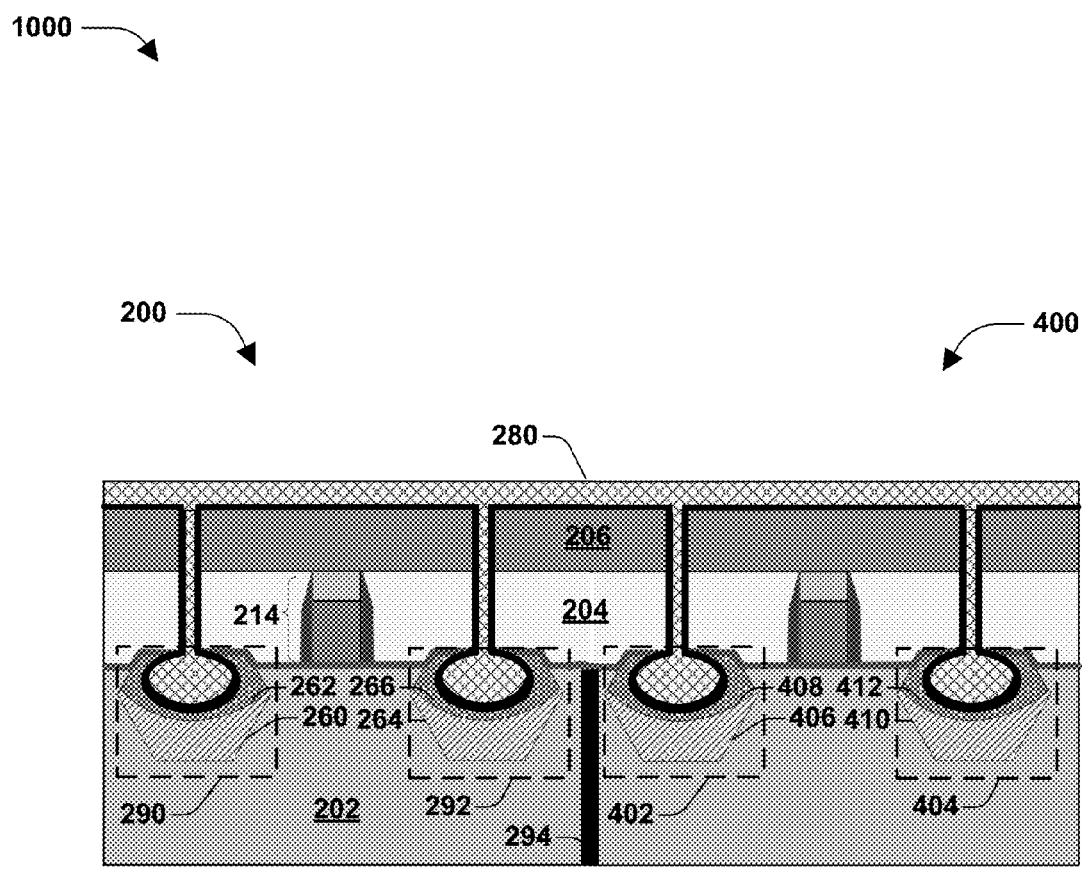
FIG. 10 is a cross-sectional view of a semiconductor arrangement, according to some embodiments.
Figure 11:
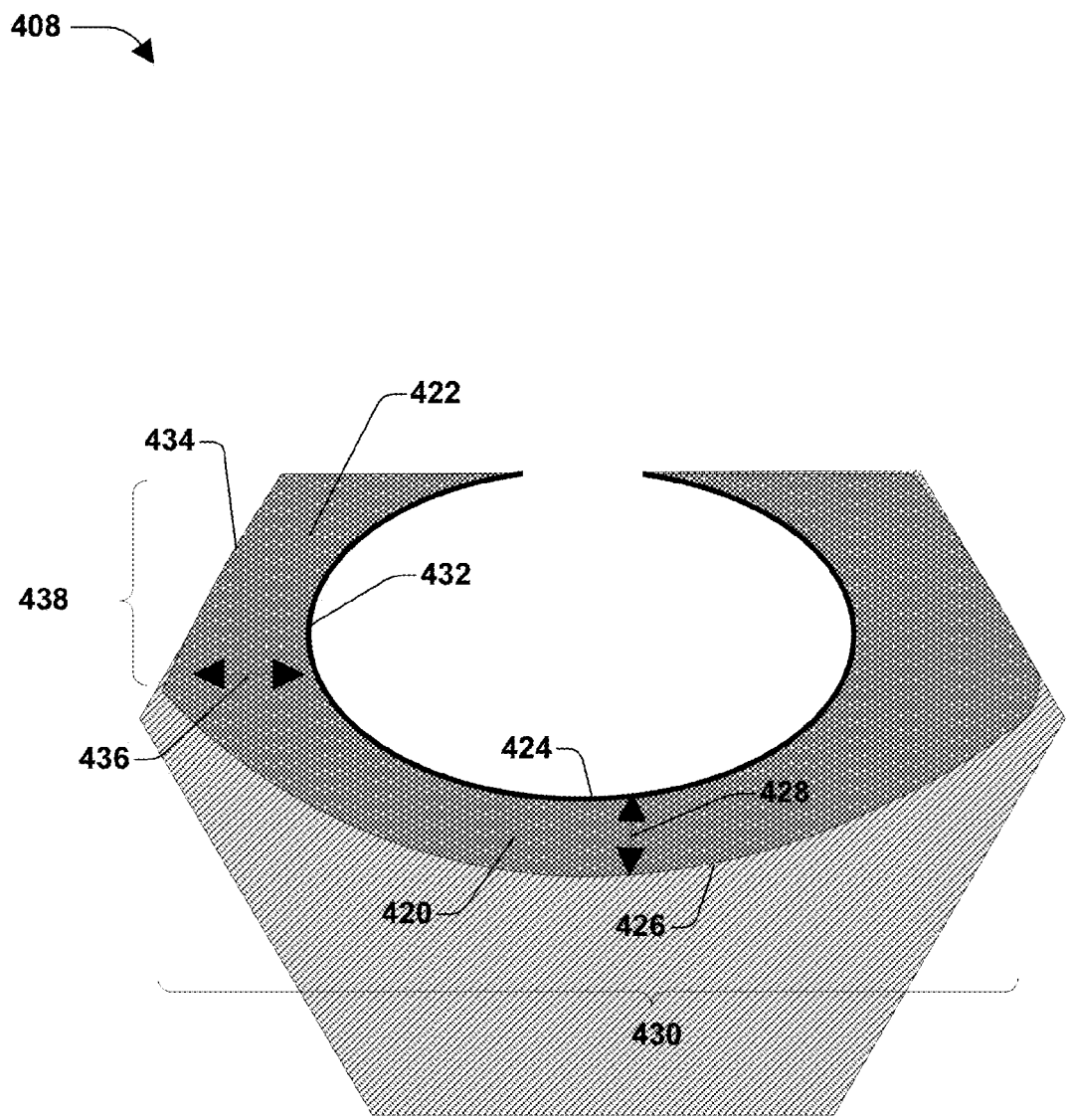
FIG. 11 is a cross-sectional view of a semiconductor device during fabrication, according to some embodiments.

In some embodiments, the first semiconductor device 200 is part of a semiconductor arrangement 1000, as illustrated in FIG. 10. In some embodiments, the semiconductor arrangement 1000 includes at least one of the first semiconductor device 200 or a second semiconductor device 400. In some embodiments, the second semiconductor device 400 is formed by a method 100 or one similar thereto. In some embodiments, the second semiconductor device 400 includes at least one of a third active region 402 or a fourth active region 404. In some embodiments, the third active region 402 includes at least one of a fifth doped region 406 or a sixth doped region 408. In some embodiments, the sixth doped region 408 is over the fifth doped region 406. In some embodiments, the sixth doped region 408 includes at least one of a third bottom portion 420 or a fifth sidewall 422, as illustrated in FIG. 11. In some embodiments, the third bottom portion 420 includes at least one of a third bottom portion inner surface 424, a third bottom portion outer surface 426, a third bottom portion height 428 or a third bottom portion width 430. In some embodiments, the fifth sidewall 422 is adjacent the third bottom portion 420. In some embodiments, the fifth sidewall 422 includes at least one of a fifth sidewall inner surface 432, a fifth sidewall outer surface 434, a fifth sidewall width 436 or a fifth sidewall height 438. In some embodiments, the fifth sidewall height 438 is greater than the third bottom portion height 428. In some embodiments, the sixth doped region 408 is concave. In some embodiments, the fourth active region 404 is similar to the fifth active region.

In some embodiments, an isolation structure 294 is formed. In some embodiments, the isolation structure 294 is disposed between the first semiconductor device 200 and a second semiconductor device 400. In some embodiments the isolation structure 294 is disposed in the substrate 202. In some embodiments, the isolation structure 294 isolates at least one of the first active region 290 or the second active region 292 from at least one of the third active region 402 or the fourth active region 404. In some embodiments, the first semiconductor device 200 has a different conductivity type than the second semiconductor device 400. In some embodiments, at least one of the first semiconductor device 200 or the second semiconductor device 400 is configured as at least one of a NMOS device or a PMOS device. In some embodiments, the first semiconductor device 200 includes the NMOS device and the second semiconductor device 400 includes the PMOS device. In some embodiments, the isolation structure 294 includes at least one of silicon oxide, silicon nitride, silicon oxynitride, fluoride-doped silicate glass (FSG) or a low-k dielectric material.

In some embodiments, at least one of the first semiconductor device 200 or the second semiconductor device 400 includes other layers or features not specifically illustrated. In some embodiments, other back end of line (BEOL) processes are preformed on at least one of the first semiconductor device 200 or the second semiconductor device 400.

According to some aspects of the instant disclosure, semiconductor arrangement is provided. The semiconductor arrangement comprising a first semiconductor device. The first semiconductor device comprising a first active region. The first active region comprising a first doped region and a second doped region over the first doped region. The second doped region comprising a first bottom portion and a first sidewall. The first bottom portion having a first bottom portion inner surface, a first bottom portion outer surface, a first bottom portion height and a first bottom portion width. The first sidewall adjacent the first bottom portion having a first sidewall inner surface, a first sidewall outer surface, a first sidewall width and a first sidewall height, the first sidewall height greater than the first bottom portion height.

According to some aspects of the instant disclosure, a semiconductor device is provided. The semiconductor device comprising a gate structure, a first active region disposed on a first side of the gate structure, a second active region disposed on a second side of the gate structure and a metal layer over at least one of the second doped region or the fourth doped region. The first active region comprising a first doped region and a second doped region over the first doped region. The second doped region comprising a first bottom portion and a first sidewall. The first bottom portion having a first bottom portion inner surface, a first bottom portion outer surface, a first bottom portion height and a first bottom portion width. The first sidewall adjacent the first bottom portion having a first sidewall inner surface, a first sidewall outer surface, a first sidewall width and a first sidewall height, the first sidewall height greater than the first bottom portion height. The second active region comprising a third doped region and a fourth doped region over the third doped region. The fourth doped region comprising a second bottom portion and a third sidewall. The second bottom portion having a second bottom portion inner surface, a second bottom portion outer surface, a second bottom portion height and a second bottom portion width. The third sidewall adjacent the second bottom portion having a third sidewall inner surface, a third sidewall outer surface, a third sidewall width and a third sidewall height, the third sidewall height greater than the second bottom portion height.

According to some aspects of the instant disclosure, a method of fabricating a semiconductor device is provided. The method comprising forming a first active region. The method of forming the first active region comprising forming an initial first doped region in a substrate, forming an opening having a first shape in the first doped region, forming an initial second doped region over the initial first doped region, the initial second doped region having a first inner surface defined by the first shape of the opening and performing an anneal to form a first doped region from the initial first doped region and to form a second doped region from the initial second doped region, the second doped region having the first inner surface.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

It will be appreciated that layers, features, elements, etc. depicted herein are illustrated with particular dimensions relative to one another, such as structural dimensions or orientations, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising:
   a first semiconductor device comprising:
      a first active region, the first active region comprising:
         a first doped region; and
         a second doped region over the first doped region, the second doped region comprising:
            a first bottom portion having a first bottom portion inner surface, a first bottom portion outer surface, a first bottom portion height and a first bottom portion width; and
            a first sidewall adjacent the first bottom portion having a first sidewall inner surface, a first sidewall outer surface, a first sidewall width and a first sidewall height, the first sidewall height greater than the first bottom portion height, wherein at least one of the first bottom portion or the first sidewall comprises a dopant gradient, the dopant gradient comprising:
               a first dopant concentration near at least one of the first bottom portion inner surface or the first sidewall inner surface; and
               a second dopant concentration near at least one of the first bottom portion outer surface or the first sidewall outer surface, the second dopant concentration being lower than the first dopant concentration.

2. The semiconductor arrangement of claim 1, wherein the first dopant concentration is about $7e^{21}$ cm$^{-3}$ to about $9e^{21}$ cm$^{-3}$.

3. The semiconductor arrangement of claim 1, wherein the second dopant concentration is about $1e^{21}$ cm$^{-3}$ to about $6e^{21}$ cm$^{-3}$.

4. The semiconductor arrangement of claim 1, wherein at least one of the first bottom portion height or the first sidewall width is about 10 to about 20 nm.

5. The semiconductor arrangement of claim 1, comprising:
   a metal layer over the second doped region.

6. The semiconductor arrangement of claim 5, wherein the metal layer comprises:
   a silicide.

7. The semiconductor arrangement of claim 1, comprising:
   an interlayer dielectric (ILD) layer over the first active region;
   an oxide layer over the ILD layer; and
   a contact extending through at least one of the oxide layer or the ILD layer and contacting the first active region.

8. The semiconductor arrangement of claim 1, comprising:
   a gate structure, the first active region disposed on a first side of the gate structure; and
   a second active region disposed on a second side of the gate structure, the second active region comprising:
      a third doped region; and
      a fourth doped region over the third doped region, the fourth doped region comprising:
         a second bottom portion having a second bottom portion inner surface, a second bottom portion outer surface, a second bottom portion height and a second bottom portion width; and
         a third sidewall adjacent the second bottom portion having a third sidewall inner surface, a third sidewall outer surface, a third sidewall width and a third sidewall height, the third sidewall height greater than the second bottom portion height.

9. The semiconductor arrangement of claim 8, wherein at least one of the second doped region or the fourth doped region is concave.

10. The semiconductor arrangement of claim 1, comprising:
    a second semiconductor device comprising:
       a third active region, the third active region comprising:
          a fifth doped region; and
          a sixth doped region over the fifth doped region, the sixth doped region comprising:
             a third bottom portion having a third bottom portion inner surface, a third bottom portion outer surface, a third bottom portion height and a third bottom portion width; and
             a fifth sidewall adjacent the third bottom portion having a fifth sidewall inner surface, a fifth sidewall outer surface, a fifth sidewall width and a fifth sidewall height, the fifth sidewall height greater than the third bottom portion height.

11. The semiconductor arrangement of claim 10, wherein the first semiconductor device has a first conductivity type and the second semiconductor device has a second conductivity type different than the first conductivity type.

12. The semiconductor arrangement of claim 1, wherein the first semiconductor device is a MUGFET.

13. A method of forming a first semiconductor device, comprising:
    forming a first active region, comprising:
       forming an initial first doped region in a substrate;
       forming an opening having a first shape in the initial first doped region;
       forming an initial second doped region over the initial first doped region, the initial second doped region having a first inner surface defined by the first shape of the opening; and
       performing an anneal to form a first doped region from the initial first doped region and to form a second doped region from the initial second doped region, the second doped region having the first inner surface.

14. The method of claim 13, comprising:
    forming a metal layer over the second doped region.

15. The method of claim 13, the first active region disposed on a first side of a gate structure, the method comprising:
    forming a second active region on a second side of the gate structure.

16. The method of claim 15, comprising:
    forming a second semiconductor device having a third active region, the second semiconductor device having a different conductivity type than that of the first semiconductor device.

17. The method of claim 13, the forming an initial second doped region comprising:

performing at least one of a plasma doping or a monolayer doping.

18. The method of claim 13, the performing an anneal comprising:
   performing at least one of a rapid thermal anneal (RTA), a dynamic spike anneal (DSA), a laser spike anneal (LSA) or an ultra sub-second anneal (uSSA).

19. A semiconductor arrangement comprising:
   a first semiconductor device comprising:
      a first active region, the first active region comprising:
         a first doped region; and
         a second doped region over the first doped region, the second doped region comprising:
            a first bottom portion having a first bottom portion inner surface, a first bottom portion outer surface, a first bottom portion height and a first bottom portion width; and
            a first sidewall adjacent the first bottom portion having a first sidewall inner surface, a first sidewall outer surface, a first sidewall width and a first sidewall height, the first sidewall height greater than the first bottom portion height; and
      a metal layer over the second doped region, the metal layer comprising a silicide.

20. The semiconductor arrangement of claim 19, wherein the first doped region has a first dopant concentration and the second doped region has a second dopant concentration different than the first dopant concentration.

* * * * *